United States Patent [19]

Gee

[11] 4,063,091
[45] Dec. 13, 1977

[54] HIGH SPEED SWITCHING CIRCUIT

[75] Inventor: Alan E. Gee, Sunnyvale, Calif.

[73] Assignee: American Optical Corporation, Southbridge, Mass.

[21] Appl. No.: 733,643

[22] Filed: Oct. 18, 1976

[51] Int. Cl.$^2$ .............................................. H01J 37/26
[52] U.S. Cl. ..................................... 250/310; 250/309
[58] Field of Search ............... 250/306, 309, 310, 311, 250/398

[56] References Cited

U.S. PATENT DOCUMENTS

| | | | |
|---|---|---|---|
| 3,509,275 | 4/1970 | Deeley et al. | 250/398 |
| 3,535,516 | 10/1970 | Mumakata | 250/310 |
| 3,931,517 | 1/1976 | Coates et al. | 250/310 |

*Primary Examiner*—Bruce C. Anderson
*Attorney, Agent, or Firm*—H. R. Berkenstock, Jr.

[57] ABSTRACT

A high-speed circuit for causing the corpuscular particle beam of a corpuscular particle microprobe such as a scanning electron microscope to be periodically and sequentially displaced from its normal path so as to, in effect, interrupt the beam's bombardment of a specimen during certain of the scanning cycle of the microprobe. In an elementary form, it includes a deflection circuit having a pair of deflection plates disposed such that the beam passes therebetween and a high-speed driving circuit to power the deflection plates, in order to achieve desired rapid response times. The driving circuit includes a high-speed switch of the type of a vertical MOSFET which is, in turn, connected to a current limiting resistance load which, in turn, is connected to the voltage source for the deflection plates. In an illustrated embodiment, one of the plates is interconnected between the resistive load and the switch such that when the switch is turned from the normal "on" position to the "off" position, the deflection voltage is applied to the plates, through the current limiting resistor; otherwise the switch functions to ground the deflection potential through the switch. The other plate is at ground potential. This high-speed switch is powered by a fast-driving circuit which is responsive to the beam-blanking information signal coming from the synchronization and scan circuitry driving the microprobe or from other logic circuitry. To further enhance the response of the circuit, a second switch is coupled across the load resistor such that this second switch is activated in a transient mode by an RC circuit to provide a low impedance charge-up path to the deflection plate upon the activation of the high-speed switch.

1 Claim, 3 Drawing Figures

HIGH SPEED SWITCHING CIRCUIT

BACKGROUND OF THE INVENTION

The present invention bears a relation to a charged particle microprobe system and, in a preferred embodiment illustrated, is included in a field emission electron column wherein the beam of charged particles (electrons) is caused to scan the surface of an object according to a predetermined pattern. In the usual embodiments of such field emission electron systems, the electron beam is caused to initially scan a specimen in a raster pattern somewhat similar to that utilized in commercial television monitors, that is, the electron beam is caused to scan the object to be irradiated much similar to the electron beam scanning the face of the cathode ray tube. The field emission electron optical column has gained wide usage in the embodiments as scanning electron microscopes which may be seen by reference to U.S. Pat. Nos. 3,678,333; 3,842,272; 3,931,517; 3,931,519; 3,925,664 and others, commonly owned by the assignee of the present invention. As may be seen in one or more of the aforementioned patents, the charged particle beam may be laid down in an interlaced pattern either in a sequential fashion or in a non-sequential fashion with interlace ratios anywhere from 1:1 one-to-one to any order of ratio such as 8:1 to 16:1.

In a present embodiment of the invention, subsequently described, the field emission electron optical column may be utilized in multiple fashions including utilizations as an electron microscope as previously referred as well as a beam-writing instrument which is capable of irradiating a specimen in such a fashion as to actually "write" thereon. In a beam-writing configuration, the actual bombardment of the beam upon the specimen causes some change in the physical characteristics of the specimen such that the changed character of the beam thereon can be later "read". In the embodiment of the invention subsequently described, the beam is caused to scan the specimen to be irradiated in the usual raster pattern such that were the beam not interrupted from bombarding the object, the entire raster pattern would be painted or written upon the surface of the specimen. In the disclosed invention, however, a deflection mechanism is included in the electron columns that for every portion of the normal scan where it is desired that the beam of charged particles not reach the object, it is deflected from its normal path and then where the beam "writing" is again desired, the deflection circuitry is de-activated and the beam returns to its normal scan. By such mechanism, alpha numeric characters might be written on microfilm, or in another application, a circuit may be etched on a suitable substrate or resist.

As may be recognized, an extremely fast deflecting mechanism is required here since the scanning of the corpuscular particles is already at television rates and are capable of laying down a full raster on the object in approximately 1/60 of a second.

Thus, the essence of the present invention lies in the circuit for forming essentially the rectangular-wave type pulse wherein the circuit exhibits a capacity for a very rapid rise time from a steady state level to a high steady state DC voltage and then a very rapid fall time again back to the first steady state or "on" condition. One of the essential characters of the circuit in order to accomplish these relatively instantaneous responses is its high resistive character. The resistive character is further accented in the usage of a switching device which in and of itself has an essentially resistive physical characteristic. This resistive maximization results from putting the switch in series with a large current-limiting resistive load. Further, the voltage drop across the switching device is minimized such that its change of state from "off" to "on" and back to "off" (or vice versa) provides little reflective influence on the circuit proper.

Further, by using a high current-limiting value and a resistive switch exhibiting a little voltage drop during its "on" condition, current flow in the circuit is minimized such that the inherent current heating of the components and thermal impact thereof is minimized, providing again, an additional degree of stability in the circuitry not otherwise achieved.

In the present embodiment of the circuit which is utilized in either an electron microscope or an electron microprobe wherein the microprobe is used in a beam-writing function, high capacitance may be experienced in the associated circuitry which the switch circuit is required to drive. In the case of the microprobe devices, deflection plates are required between which a potential is established in order to deflect the electron beam off its normal axis. It should be realized that when this voltage is applied to deflect the beam, some period of time is required for a "charge-up" of the deflection plates and thus slowing the speed of any switching function. Where high speeds are required, naturally, one must minimize this "charge-up" delay and maximize the speed with which the circuit operates.

Thus, in the illustrated embodiment, an additional function is included to compensate for this characteristic. To provide this additional compensation, a second switch is included which is connected between the deflection plates potential source, and the plates, essentially shunting out the current-limiting resistor momentarily. This switch is actuated with the "off" actuation of the first switch. However, it is maintained "on" only for a transient period of time which is determined by an RC differentiator circuit. The time constant of the RC circuit is such that the direct application of the deflection plate, the potential from the source directly to the plates occurs only during this otherwise slow charge-up period and, in effect, provides a very low impedance source for the deflection plates during this period of time; thus, squaring off as it were the rise time and rise trace of the voltage applied to the deflection plates thereby speeding the response time. As one skilled in the art reads the following description of one of the preferred embodiments, additional areas of application for the quick response circuit will become evident.

SUMMARY OF THE INVENTION

In accordance with certain of the features of the invention disclosed, there is included a high-speed, high voltage and temperature stable circuit suitable for the switching of up to large voltages (in the several hundred volt range) in very rapid times, as in the order of 50 to 100 nanoseconds, and less. In this novel circuit, a semi-conductive switch with a resistive character is coupled in series with a current-limiting resistor and the voltage source to be switched. In the preferred arrangement, the load to be switched is connected between the limiting resistor and the switch, with the voltage source on the resistor side and ground source on the switch side. By maintaining a favorable resistance ratio between the limiting resistor and the switch, voltage and current ripple are minimized, providing a voltage and temperature stable circuit. In those installations as the illustrated embodiment wherein the switched circuit includes a high capacitance or inductance, second switching means should be included to provide a low impedance charge-up of the circuit to enhance response time.

DESCRIPTION OF THE PREFERRED EMBODIMENT

Figure 1:
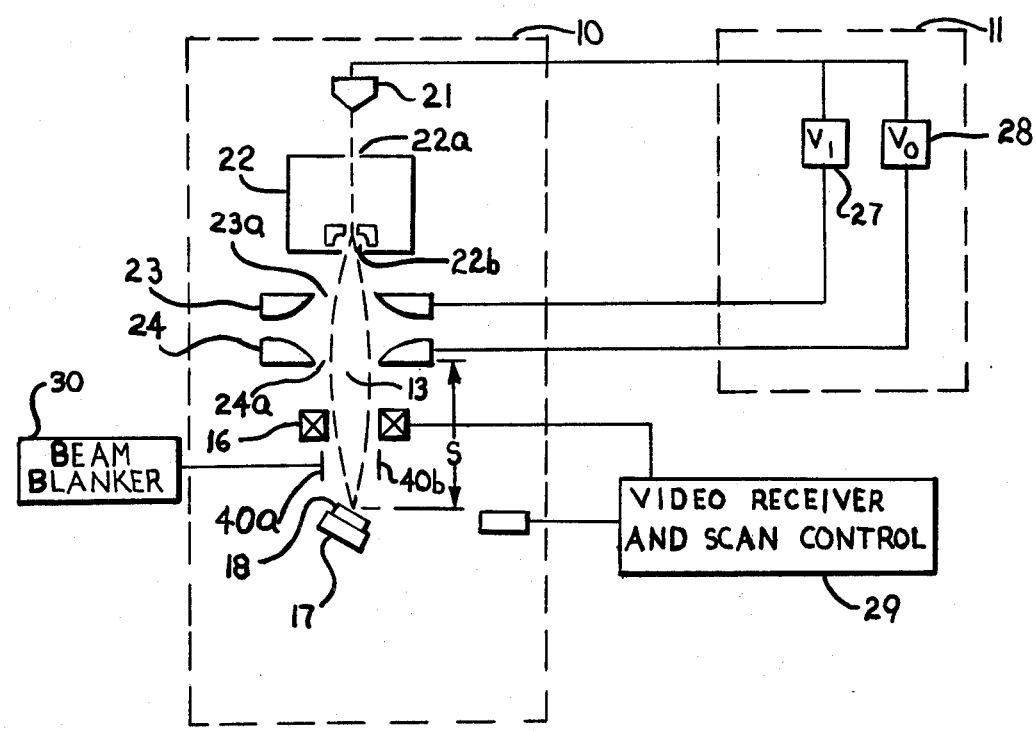
FIG. 1 is a diagrammatic view of an electron microprobe in which the invention may be embodied.

The present invention as illustrated in the subsequently described embodiment is functionally included within an electron optical column which may be seen in FIG. 1, in the form of a scanning electron microscope 10. As previously stated, the invention may be embodied in other electron optical systems such as one devoted exclusively to the field known as beam-writing. It might also be embodied in other apparatus as well. It is significant to point out while the illustrated electron optical system includes a field emission electron gun to produce the electrons as the emanating particles, it is possible the same source could be used to produce other charged particles, for example, a positive charged particle such as ions. The invention also can be utilized in devices using conventional electron sources of the thermionic type as opposed to field emission devices.

By way of further description of the electron optical column and specifically the embodiment herein in the scanning electron microscope 10, there is shown a potential source of voltage means 11 which provides the various levels of operating voltages to the electrodes in the scanning microscope 10. A second unit, the video receiver and scanning control 29 in combination with the scanning and detector portions of the scanning electron microscope 10 display the desired view of specimen undergoing interrogation.

The field emission tip 21 constitutes a main feature of a field emission scanning electron microscope system. It produces a highly coherent, high intensity supply of electrons capable of being focused to a spot of desired size as at an image plane containing a specimen 18. In the illustrated embodiment, specimen 18 is shown mounted to a specimen holder 17 which positions it with respect to the focused beam 13. The beam of charged particles (electrons) as in the system of configuration of FIG. 1 is primarily formed by electrode means comprising electrode 23 and electrode 24. Electrode 23 constitutes an intermediate electrode interposed between the field emission tip 21 and a main electrode 24 located distally of intermediate electrode 23 with respect to the field emission tip 21. Both electrodes 23 and 24 have apertures 23a and 24a axially aligned with the field emission tip 21 for focusing and accelerating the electrons forming the beam of charged particles 13. In the broad context of a field emission system wherein the emitted corpuscular particles may be either positive (ions) or negative (electrons), numbers 23 and 24 are generally denoted electrodes.

Main accelerating voltage $V_0$ 28 is supplied to electrode 24 and its magnitude is selected relative to the potential of emission tip 21. Normally, when used as an electron source, the field emission tip 21 is placed at a low potential below system ground with the main accelerating electrode held at ground. Intermediate electrode 23 is supplied by a voltage source $V_1$ 27 which potential is lower than the potential of the electrode or anode 24 with respect to the charged particles forming the beam. The magnitude of voltage $V_0$ is, of course, indicative of the final particle energy for the ratio of the intermediate electrode voltage $V_1$ and $V_0$ is essentially determinative of the focal distance of the beam below anode 24 which distance is indicated as S in FIG. 1. Extraction electrode 22 is in justa-position to field emission tip 21 and has centrally located apertures 22a and 22b axially aligned with apertures of electrodes 23 and 24 and the field emission tip 21. Thus, electrons extracted from the field emission tip 21 pass through the apertures of the extraction electrode 22 and anodes 23 and 24 to be finally focused upon the specimen 18. The lens system 16 is primarily intended for control of the beam 13 to scan the specimen 18 in a programmed manner, and essentially constitutes deflection coils synchronized to the scanning system for control of the videl receiver 29 thereby locking the scan of the specimen 18 and the scan of the video receiver 29.

Applicant has discovered that in the case of an electron beam-writing system wherein deflection plates 40a and 40b are included along the normal axis of beam 13 that it is necessary that the voltage applied to such deflection plates 40 must have a very sharp rise time characteristic such that the applied voltage to the deflection plates goes from the ground potential to the bias potential in a minimal period of time. In the case of the present invention, this time is in the order of 50 to 100 nanoseconds or less. Thus, there is included within the electron optical system a switching circuit 30 to power deflection plates 40 according to the required characteristics.

In the illustrated embodiment, deflection plates 40 are shown to be within the confines of the electron column, between electrode 24 and specimen 18.

Figure 2:
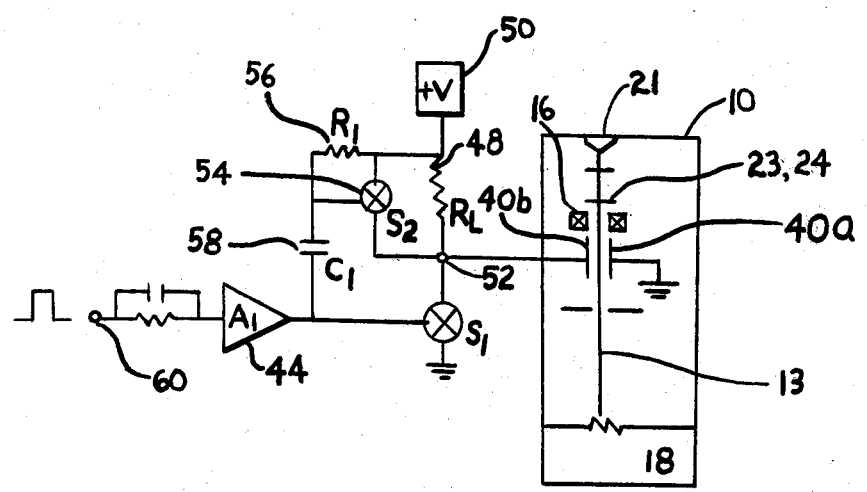
FIG. 2 is a schematic view of one embodiment of the invention.

Referring now to FIG. 2, the basic components of the beam-blanking circuit utilized in the described embodiment will be described. As will be seen, FIG. 2 is a functional diagram showing the electron column 10 including the field emission tip 21, the extraction electrode 22, the accelerating focusing anodes 23, 24 and the specimen. It is to be noted that plate 40a is connected to ground and plate 40b is connected to the deflection circuitry. In deflection circuitry 42, fast-driving amplifier 44 is connected to first switching element 46. The load which is switched by first switch 46 is a current-limiting resistance load 48 which, in turn, is connected to the beam-deflecting voltage source 50. Connected between the beam-deflecting voltage source 50 and the junction 52 between the resistance load and first switch 46 is a second switch 54 whose function is inverted to that of switch 46. Resistance 56 and capacitor 58 form a differentiator circuit 56 functionally controlling switch 54, its "on" time being determined by the specific values of the resistance and capacitance of the differentiator circuit 56. The driving amplifier 44 received an input signal on line 60 from the beam-blanking information source such as a digital input source which instructs the beam from field emission tip in the column to either "write" or "blank".

In operation, if the input signal on line 60 to the driving amplifier is zero, or switch 46 is configured to be in the "on" state ("write") and the active plate 40b is above ground by the voltage drop across the switch 46. Thus, it may be seen that the voltage applied between the plates 40a and 40b during this "on" state is a function of the resistance of the device used for switch 46 and the current through it. It is desirable for this resistance to be as low as possible to insure minimum static influence on the electron beam. This voltage drop must be stable with time to an order of magnitude below that which will seriously effect the beam. In the illustrated embodiment, the stability must be to a level of micro volts. It follows, then, that by causing the ratio of resistance of the limiting resistor 48 to that of the switch 46 to be greater than a predetermined value, the stability of the circuit can be controlled.

Recognizing that any current flow in an electrical circuit introduces thermal considerations when the state of current flow changes, it is desirable to minimize the current switched. In order to accommodate these factors in the present invention, resistance 48 is made large in value. Thus, with little current flowing in the circuit and switch 46 already chosen to have a very low voltage drop value, little change of actual current is seen in the deflection portion of the circuitry when the switch 46 changes state. Further, with little change in current flow there is minimal thermal impact upon the circuit due to changing current.

With the large value of resistance at resistor 48, when switch 46 is switched off, the application of voltage +V from the voltage source 50 is applied at plate 40b through resistor 48. It should be recognized at this point that the deflection plates 40 comprise a capacitor. In addition, there may be substantial stray capacitance existing in the circuitry as well. Thus, it should be appreciated that a significant resistance/capacitance circuit exists in the deflection plate circuit with perhaps a long time constant for the charge-up of the plates 40 through resistance 48. Considering that high speed is required for proper activation of the circuit, second switch 54 is included which operates in a trasient manner during the charge-up of the plates through the resistive load 48. This is accomplished by causing the second switch 54 to be actuated "on" momentarily while the first switch 46 is actuated "off". It is pointed out that second switch 54 is connected between the voltage deflection source 50 and plates 40b so that when it is actuated to the "on" condition, it provides a low impedance voltage source for plate 40b directly from the deflection voltage source 50. Once the plate is charged to the +V value, it is important then to remove the direct voltage application from the circuit and then provide potential through resistive load 48. By providing switch 54 with a differentiator drive in the form of an RC circuit, it can be controlled to the "on" for a transient period of time equivalent to the time constant of the RC differentiator circuit.

It is to be appreciated that the main driving circuit can be either inverting or non-inverting depending upon the logic choice made. Also, the resistive load 48 could go to ground and the first switch 46 to the blanking voltage, if desired, although this would require large voltage offset in the driver. These factors are matters of design choice and in the illustrated embodiment for a beam-blanking circuit for an electron microprobe, the illustrated choices were deemed to be the more advantageous.

Figure 3:
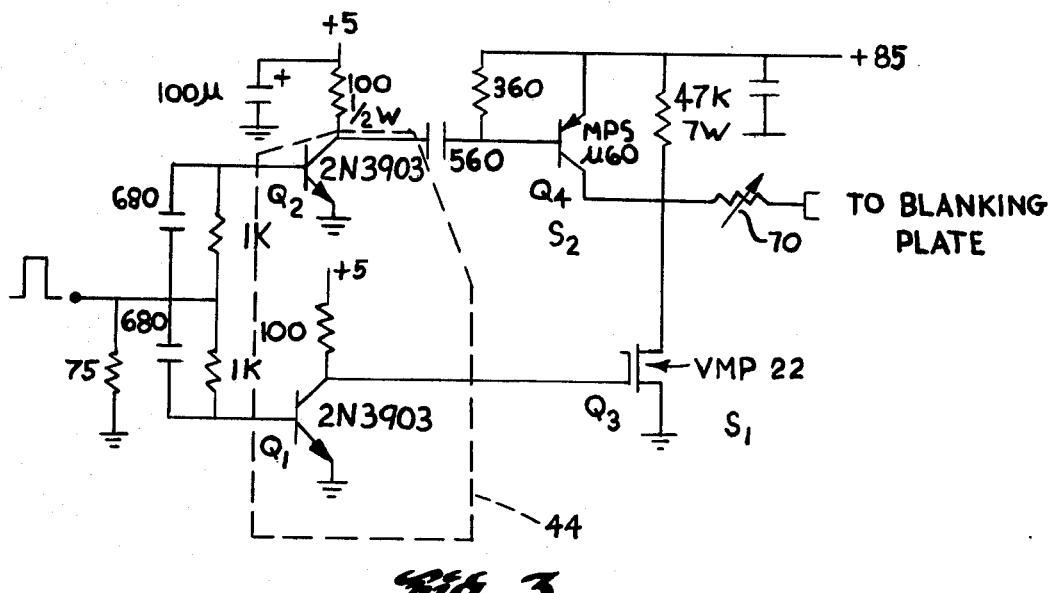
FIG. 3 is a diagram of a specific embodiment of the invention of FIG. 2.

FIG. 3 provides an illustration of a practical embodiment of the circuitry illustrated in functional form in FIG. 2. Driver amplifier 44 is composed of two transistors Q1 and Q2 each being 2N3903 devices coupled in parallel. By using parallel devices in the preferred embodiment, additional speed may be achieved as well as independent control of the drive to first switch 46 and second switch 54. First switch 46 is shown at Q3 being a VMP22. The VMP22 is a vertical MOSFET transistor available from Siliconex Company. This particular device is essentially a pure resistance switch. When a positive voltage is supplied to its gate, it exhibits a very low resistance value. In this particular embodiment, with the gate at +5 volts the resistance shown is approximately 3 Ohms.

As described earlier in the functional drawing of FIG. 2, the current limiting of resistor 48 is, in the preferred embodiment, given a value of 47 kilohms. In the preferred embodiment, 85 volts positive from the deflection potential is found to provide effective blanking. Thus, in the illustrated circuit of FIG. 3, a current of 2 milliamps may be expected in the current leveling resistor. With these values, the "on" voltage drop at the first switch 46 may be calculated to be only 6 millivolts, thus achieving the low value desired, as previously discussed.

It may be said, then, that the resistance ratio in the present embodiment is 47000/3 or approximately 15000:1. Thus, it should be recognized that any ripple inherent in the voltage drop across switch 46 is 1/15000 of that produced from source 50. Likewise, any fluctuation, due to switching switch 46 presents little impact on the total circuit due to the low values of voltage and current being switched. These factors illustrate the high stability of the inventive switching circuit.

Further, if the current-limiting resistance at 48 is a low temperature coefficient resistor, greatly underrated for wattage, the thermal change that may be expected in the device will also be very small. Thus, because of the Q3 very low "on" resistance and the very small load current, the thermal effects may be held to negligible values. Also, in the output of the first switch 46, a series resistance may be added as at 70 to drive a short cable, if desirable.

Turning now to the second switch 54, it is desirable to utilize a fast-switching transistor since the function of the switch is transient in character. In the illustrated embodiment, an MPS μ60 was utilized, being a relatively slow 300v transistor. This particular switch provides 100 nanosecond response in the illustrated circuit. Should a quicker blanking be desired, a faster transistor such as a 2N5401 or 2N3637 may be utilized.

It is also to be noted that the first switch S1 is an N-channel device and the second switch 54 is a PNP transistor. One may thus note that their switching action is opposite. In this respect, the input signal to driver is effective to turn Q3 off and Q4 on. As was discussed in the previous Figure, the RC circuit activating the second switch (Q4) operates it only for a transient period such that it remains "on" only during the time constant of the RC circuit and then turns off automatically. It may then be seen that a signal from the driver turning Q3 "on" again has no effect on Q4 since it is already "off".

By way of alternative embodiments, one may use a dual digital clock driver instead of the Q1 and Q2 and associated circuitry for the driving amplifier. For those embodiments requiring increased speed over the illustrated embodiment, this digital clock driver would provide advantage.

It should be appreciated that other modifications may be made to the illustrated circuitry without departing from the spirit of the invention. Specifically, it should be appreciated that the combination of the supplemental switching of the second switch 54 in conjunction with the vertical MOSFET first switch and the high value current-limiting resistance provides a circuit with very stable high-speed and high voltage capability which is adaptable to a variety of switching applications requiring these characteristics. In this regard, the below-claimed invention may be expected to have a variety of applications beyond that illustrated in the high-speed switching or deflecting of an electron beam in a microprobe.

I claim:

1. In a scanning charged particle microprobe comprising a charged particle gun for generating a beam of charged particles directed to impinge upon a specimen, scanning means to cause said beam to scan the surface of said specimen, the improvement comprising:

a high-speed beam-deflecting circuit comprising a pair of deflection plates disposed intermediate the charged particle gun and said specimen so disposed such that said beam is also intermediate each of said pair of plates;

means connecting one of said plates to grounding means;

a voltage source electrically connected to the other of said pair of plates for deflecting said beam;

current-limiting resistive means connected in series with said beam-deflecting voltage source and said other beam-deflecting plate;

vertical MOSFET switch means connected to said deflection circuit at a point intermediate said current-limiting resistance means and said other plate, said limiting resistor and said switch having a predetermined resistance ratio;

a ground source connected to the other side of said switch means;

actuating means for said switch operationally connected to an informational signal carrying beam-blanking instructions and connected to said switch so as to drive said switch in response to said information signal;

second semi-conducting switching means connected to a point intermediate said plate and said current-limiting resistor and said deflection potential source, said second switch being operated during the transient time substantially equal the resistance-capacitive network forming said plates and current-limiting resistor.

* * * * *